(12) United States Patent
Vafi et al.

(10) Patent No.: US 6,946,661 B2
(45) Date of Patent: Sep. 20, 2005

(54) METHODS AND APPARATUS FOR X-RAY IMAGE DETECTOR ASSEMBLIES

(75) Inventors: Habib Vafi, Brookfield, WI (US); Jeffrey Alan Kautzer, Pewaukee, WI (US); David Conrad Neumann, Milwaukee, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 260 days.

(21) Appl. No.: 10/327,734

(22) Filed: Dec. 23, 2002

(65) Prior Publication Data

US 2004/0120453 A1 Jun. 24, 2004

(51) Int. Cl.[7] ................................................. G01T 1/24
(52) U.S. Cl. ................................................. 250/370.99
(58) Field of Search ....................... 250/370.09, 370.11

(56) References Cited

U.S. PATENT DOCUMENTS

| | | | |
|---|---|---|---|
| 5,736,732 A | 4/1998 | Possin et al. | |
| 5,912,465 A | * 6/1999 | Kobayashi et al. | ..... 250/370.09 |
| 6,073,343 A | 6/2000 | Petrick et al. | |
| 6,149,301 A | 11/2000 | Kautzer et al. | |
| 6,259,098 B1 | * 7/2001 | Vafi et al. | ............... 250/370.09 |
| 6,510,195 B1 | * 1/2003 | Chappo et al. | ................ 378/19 |

* cited by examiner

*Primary Examiner*—Constantine Hannaher
(74) *Attorney, Agent, or Firm*—Carl B. Horton, Esq.; Armstrong Teasdale LLP

(57) ABSTRACT

A method for coupling an X-ray image detector to an X-ray image receptor is provided. The method includes providing at least two image detectors. The two image detectors each have at least one inner edge for substantial inner edge contact between the at least two image detectors to form a detector array. The two image detectors each have at least one outer edge to form an outside perimeter of the detector array. The method further includes coupling an area proximate the outside perimeter of the detector array to the image receptor.

25 Claims, 3 Drawing Sheets

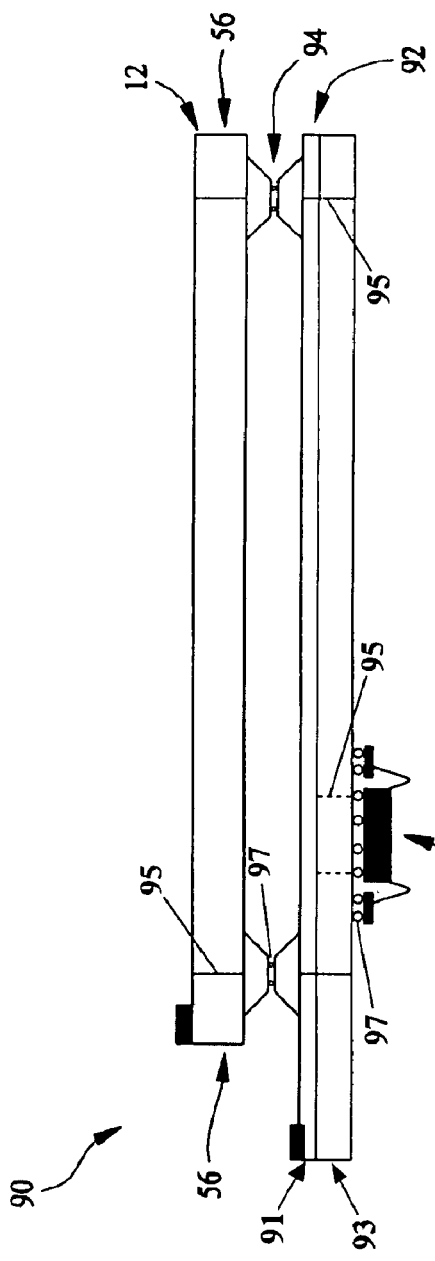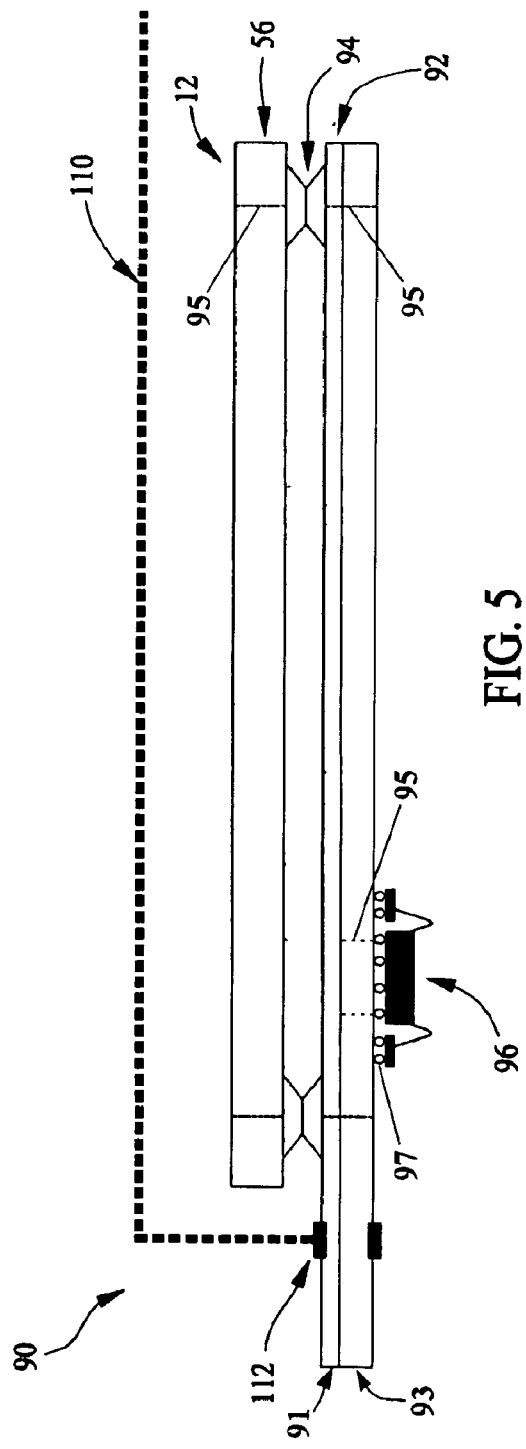

METHODS AND APPARATUS FOR X-RAY IMAGE DETECTOR ASSEMBLIES

BACKGROUND OF THE INVENTION

This invention relates generally to x-ray diagnostic medical imaging and more particularly, to methods and apparatus for x-ray image detector assemblies.

In many x-ray imaging system configurations, an x-ray source projects an area beam which is collimated to pass through a region of interest of the object being imaged, such as a patient. The beam, after being attenuated by the object, impinges upon an array of radiation detectors. The intensity of the radiation beam received at the detector array is dependent upon the attenuation of the x-ray beam by the object. Each detector element, or pixel, of the array produces a separate electrical signal that is a measurement of the beam attenuation at that location of the detector. The attenuation measurements from all the detector pixels are acquired separately to produce a transmission profile.

Digital X-Ray image detectors are either fabricated on a monolithic substrate, such as glass or crystaline silicon, or on multiple substrates, which must then be integrated into a single image detector. One limitation is that crystalline silicon (Si), whether single crystal silicon (X—Si) or poly-crystalline silicon (P—Si), is only available to be processed in wafer sizes that are significantly smaller than the desired sizes of X-ray image detectors for some medical applications. This limitation has led to the development of X-ray image tiled detector assemblies. However, the interconnection of multiple substrates into a single image detector presents challenges for achieving low-to-zero defect connections on large arrays, and also presents challenges in avoiding image defects at the interior edges of the arrays, where two substrates are adjacent and share a seam.

BRIEF DESCRIPTION OF THE INVENTION

In one aspect, a method for coupling an X-ray image detector to an X-ray image receptor is provided. The method includes providing at least two image detectors. The two image detectors each have at least one inner edge for substantial inner edge contact between the at least two image detectors to form a detector array. The two image detectors each have at least one outer edge to form an outside perimeter of the detector array. The method further includes coupling an area proximate the outside perimeter of the detector array to the image receptor.

In another aspect, an X-ray image detector assembly is provided. The X-ray image detector includes an image detector and at least a first detector tile and a second detector tile. The first and second detector tiles each having at least one inner edge. The first and second tiles contact each other along their respective inner edges to form a detector array. The first and second tiles each have at least one outer edge to form an outside perimeter of the detector array. The X-ray image detector further includes an image receptor coupled to an area proximate the outside perimeter of the detector array.

In another aspect, a method for coupling a medical X-ray image detector to an X-ray image receptor is provided. The method includes providing at least two medical image detectors. The two medical image detectors each have at least one inner edge for substantial inner edge contact between the at least two medical image detectors to form a detector array. The two medical image detectors each have at least one outer edge to form an outside perimeter of the detector array. The method further includes coupling an area proximate the outside perimeter of the detector array to the image receptor.

In another aspect, a method for coupling an X-ray image detector to an X-ray image receptor is provided. The method includes providing at least one silicon crystal detector tile for the image detector and coupling the image detector to the image receptor by fabricating through vias in the image detector to solder bump arrays between the image detector and the image receptor.

In a further aspect, an X-ray image detector assembly is provided. The image detector includes at least one silicon crystal detector tile. The image detector further includes an image receptor coupled to the image detector by through vias in the image detector to solder bump arrays between the image detector and the image receptor.

BRIEF DESCRIPTION OF THE DRAWINGS

FIG. 4 is a schematic of an X-ray image detector assembly.

FIG. 5 is a schematic of one embodiment of an X-ray image detector assembly.

DETAILED DESCRIPTION OF THE INVENTION

Figure 1:
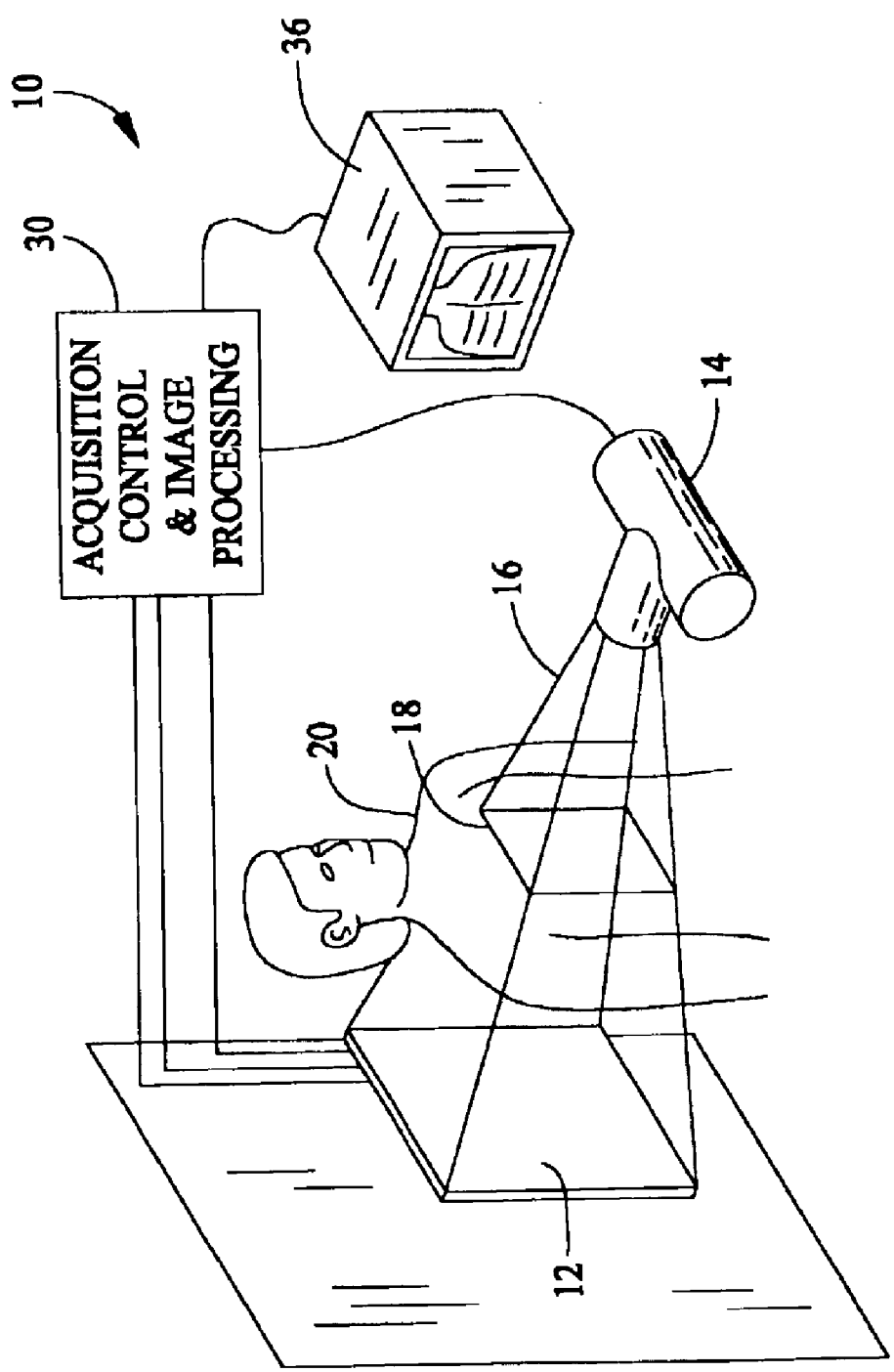
FIG. 1 is a perspective view of an imaging system.

FIG. 1 is a perspective view of an imaging system 10, for example, an x-ray imaging system, is shown as including a detector array 12 and an x-ray source 14 collimated to provide an area x-ray beam 16 passing through an area 18 of a patient 20. Beam 16 is attenuated by an internal structure (not shown) of patient 20 to then be received by detector array 12 which extends generally over an area in a plane perpendicular to the axis of the x-ray beam 16.

System 10 also includes an acquisition control and image processing circuit 30 which is electrically connected to x-ray source 14 and detector array 12. More specifically, circuit 30 controls x-ray source 14, turning it on and off and controlling the tube current and thus the fluence of x-rays in beam 16 and/or the tube voltage and thereby altering the energy of the x-rays in beam 16. In one embodiment, acquisition control and image processing circuit 30 includes a data acquisition system (DAS) having at least one DAS module, or circuit (not shown in FIG. 1), which samples data from detector array 12 and transmits the data signals for subsequent processing. In one embodiment, each DAS module includes a plurality of driver channels or a plurality of read out channels. Acquisition control and image processing circuit 30 receives sampled x-ray data from DAS and generates an image and displays the image on a monitor, or cathode ray tube display 36 based on the data provided by each pixel.

Figure 2:
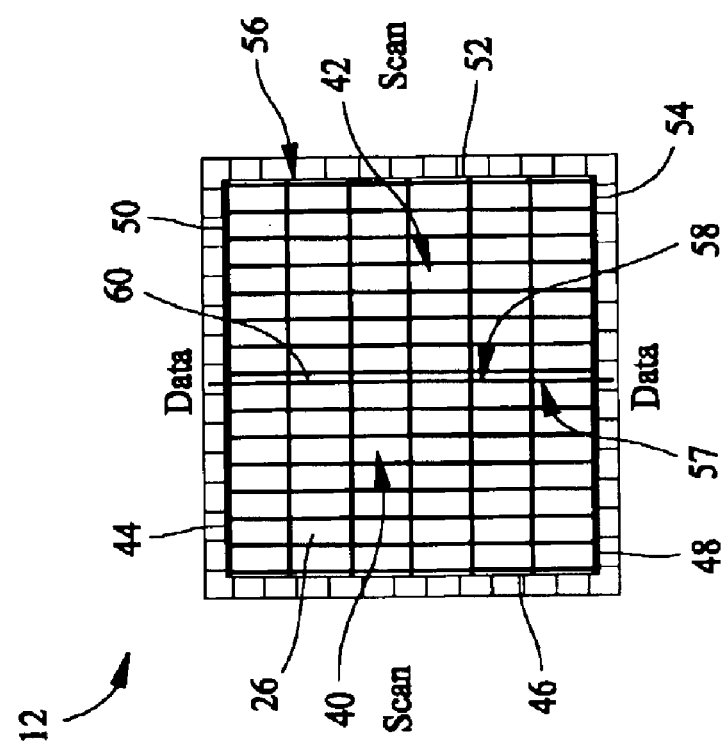
FIG. 2 is a top view of a two tile image detector array for use with the imaging system of FIG. 1.

FIG. 2 is a top view of a two tile image detector array 12 for use with the imaging system of FIG. 1. In one embodiment, detector array 12 is fabricated in a solid-state panel configuration having a plurality of detector elements, or pixels 26 as shown in FIG. 2, arranged in columns and rows. The orientation of the columns and rows is arbitrary, however, in the exemplary embodiment the rows extend horizontally and the columns extend vertically. Each pixel 26 includes a photosensor, such as a photodiode, that is coupled via a switching transistor to two separate address lines, a scan line and a data line. The radiation incident on a scintillator material (not shown) and the pixel photosensors measure, by way of change in the charge across the photodiode, the amount of light generated by x-ray interaction with the scintillator. As a result, each pixel 26 produces an electrical signal that represents the intensity, after attenuation by patient 20, of an impinging x-ray beam 16. In one embodiment, detector array 12 is approximately 40 cm wide (x-axis) by 40 cm in height (z-axis). In other embodiments, the size of detector array 12 may be altered for the specific system requirements.

Two tile image detector array 12 is formed by a first detector tile 40 and a second detector tile 42. In one embodiment, image detector tiles 40 and 42 are made by chemical vapor deposition (CVD) onto crystalline Si substrates, whether single crystal or polycrystalline. Each tile 40 and 42 includes, on its image reception side, of an array of photodiodes and field effect transistors (FETs) fabricated on the Si substrate, (switch matrix array), onto which a scintillator layer is then deposited. The scintillator layer converts X-ray photons into visible-spectrum photons, which are then converted into an electrical signal by the photodiode and read out through the FET. The electrical signal of each photodiode is quantified by a digital-to-analog converter (not shown). There are two orthogonal sets of connections in the switch matrix, the scan connections, which control the FET switches, and the data connections, through which the photodiode signals are connected to the data readout electronics.

First and second detector tile 40 and 42, each have at least one outer edge to form an outside edge of detector array 12. In the exemplary embodiment, first detector tile 40 has three outer edges 44, 46, and 48 and second detector tile 42 has three outer edges 50, 52, and 54 to form outside perimeter 56 of detector array 12. First detector tile 40 has at least one inner edge 57 and second detector tile 42 has at least one inner edge 58. First detector tile 40 and second detector tile 42 substantially contact each other along their respective inner edges 57 and 58 at an interior seam 60 to form detector array 12. Inner edges 57 and 58 within the interior of detector array 12 are not used for connections, which simplifies joining the tiles without image defects on the interior seam 60.

Outer edges 44, 46, 48, 50, 52, and 54 may be configured for either scan or data connections. In one embodiment, outer edges 44 and 50 are configured for scan connections, and outer edge 46 is configured for data connections. In another embodiment, outer edges 46 and 52 are configured for scan connections, and outer edges 48 and 54 are configured for data connections. This second configuration is particularly suited to detectors with smaller pixel pitch dimensions (such as mammography detectors) than detectors for which only two edges of each tile are used for connections, since they allow for more data readout devices to be connected to the same area of detector. In another embodiment, detector arrays use two, three, or four edges depending on design considerations. In one example, using all four edges enables faster data acquisition for fluoroscopy, with opposing edges for scan and data. In radiography, for example, costs are reduced by using only two or three edges for data acquisition (whether single edge for each of scan and data, or single edge for scan and two opposite edges for data, or single edge for data and two opposite edges for scan).

Figure 3:
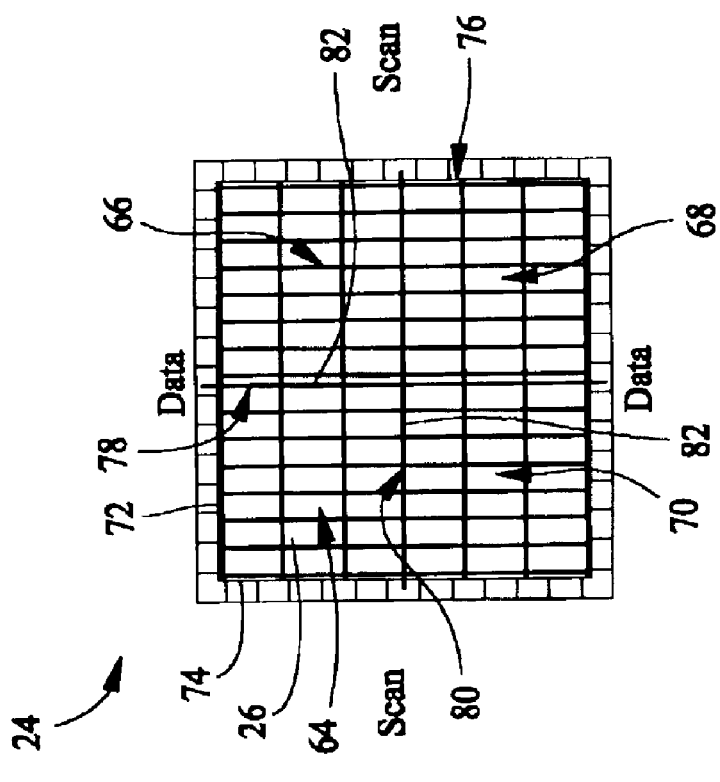
FIG. 3 is a top view of a four tile image detector array for use with the imaging system of FIG. 1.

FIG. 3 is a top view of a four tile image detector array 24 for use with the imaging system of FIG. 1. Four tile image detector array 24 is formed by a first detector tile 64, a second detector tile 66, a third detector tile 68, and a fourth detector tile 70. First detector tile 64 has, for example, two outer edges 72 and 74 which partially form an outside perimeter 76 of detector array 24. First detector tile 64 has two inner edges 78 and 80 for contacting inner edges of second detector tile 66 and fourth detector tile 70 along an interior seam 82. At least one outer edge of each tile is used for scan connections, and at least one other outer edge of each tile is used for data connections. In one embodiment, only outer edges on two sides (one scan and one data) of outside perimeter 76 of four tile image detector array 24 is needed for connections. For example, a detector array for radiography, such as mammography, utilizes only two sides (one scan and one data) to minimize other electronic hardware. In another example, a detector array for fluoroscopy may need scan and data connections on all available edge length of outside perimeter 76 to allow data readout fast enough for the application.

In the exemplary embodiment shown in FIG. 3, each detector tile of four tile image detector array 24 has a single outer edge dedicated to scan connections, and a single outer edge dedicated to data connections. These same tiles can also be used to assemble the two-tile detector, using only two exterior edges of each tile for the scan and data connections.

FIG. 4 is a schematic of an X-ray image detector assembly 90. FIG. 5 is a schematic of one embodiment of an X-ray image detector assembly with image detector 12 coupled to an image receptor 92. Specifically,detector array 12 is coupled to an area proximate outside perimeter 56 of image receptor 92. In one embodiment,outside perimeter 56 is coupled to an area proximate outside perimeter 56 of image receptor 92 using at least one flex circuit 94 including conductive traces on flexible substrates,which may be attached either by soldering or by flexible anisotropic conductive adhesive film. Flex circuit 94 connects an area proximate outside perimeter 56 of detector array 12 to corresponding connections on image receptor 92, as shown in FIG. 5. Image receptor 92 is made from Si wafers 91 onto which a data readout device 96 has been fabricated or attached. Image receptor 92 is either larger in extent than detector array 12, or is offset diagonally from detector array 12, or both,allowing edge connection of image receptor 92 to a substrate layer. Substrate layer 93 is typically composed of Bismalemide Triazene (BT) epoxy resin or other circuit board material. In another embodiment,image receptor 92 uses through-vias 95 to solder bump arrays 97 between detector array 12 and image receptor 92, and image receptor 92 can thereby be bump-array soldered to the substrate layer 93, prior to assembly of detector array 12 disposed on top of image receptor 92. In another embodiment,outside perimeter 56 is coupled to image receptor 92 using a combination of flex circuit 94 and through-vias 95.

In one embodiment,detector array 12 and image receptor 92 have insufficient distance between them for using flex circuit 94 for coupling therebetween. In this case,coupling detector array 12 to image receptor 92 is accomplished by fabricating through-vias in the detector tiles of the detector array 12, and solder bump arrays on the back side of the detector tiles. Since outside perimeter 56 of detector array 12 is not utilized for coupling,any number of detector tiles may be assembled into a detector array. Image receptor 92 is fabricated with readout electronics 96 either mounted or fabricated directly on the side away from the detector array. Readout electronics 96 are coupled by through-vias 95 to solder bump arrays on the side toward the detector array. The two sets of tiles are then bump soldered together to form image detector assembly 90. Coupling image detector assembly 90 to a system (not shown) is made by coupling flex circuit 94, whether by soldering or anisotropic conductive film (ACF), to the back sides of image receptor 92. The back side of image receptor 92 is also used for physical attachment to a substrate layer resulting in compact interconnect formation to integrate data readout electronics to the image detector array 12.

Use of the single crysal or polycrystalline silicon wafer enables the through-via connection method from the front side to the back side of the detector tile of detector array 12. This allows use of both the back side of the detector tile, and also allows connection to three-dimensional packaging, such as additional electronic layers behind the detector tile layer.

After detector array 12 is coupled to image receptor 92, a CsI scintillator crystal layer is applied to the image reception surface of detector array 12 by means of chemical vapor deposition. Then the cover assembly 110 is attached with a hermetic seal 112, as shown in FIG. 5.

Eliminating interconnections between detector tiles within the image detector array 12, whether by coupling outside edges 56 and 76 of the detector arrays 12 and 24, or by coupling directly through detector tiles of detector array 12 to layers behind the image receptor 92, such as on the back side of a detector tile (or on a second device layer bump-soldered to the back side of detector tile) avoids image defects along seams 58 and 82 of image detector arrays 12 and 24.

The above described image detector assembly enables separate fabrication of the detection-wafer fabrication process steps from the electronic readout fabrication process steps, by moving the readout electronics either to the back side of the detection wafer, or to a second substrate layer (readout tiles) behind the detection wafer. This broadens the choice of process techniques and process vendors which can be used for each set of processes applied to these surfaces. For example, it allows a change from the use of molybdenum to aluminum in fabrication of conductor lines in the detector matrix array.

The above-described image detector assembly allows use of process technologies developed for X-ray detectors on a substrate of amorphous silicon on glass to be used on single-crystal or polycrystalline silicon wafers, which are more common in industry. The above described image detector assembly allows use of integrated high-density interconnects at the wafer for assembly of tiles into a larger detector than can be made on a single wafer. The above described image detector assembly allows use of pick-and-place automation to reduce labor in assembly process. Use of single crystal or polycrystalline silicon as the substrate for the readout electronics wafers, allows fabrication of metalized layers around the perimeter of the detector to which a cover assembly can be attached with a hermetic seal. This provides better protection of the CsI scintillator crystals on the detection wafers than known epoxy sealing technology.

Exemplary embodiments of an image detector assembly are described above in detail. The assemblies are not limited to the specific embodiments described herein, but rather, components of each assembly may be utilized independently and separately from other components described herein. Each image detector assembly component can also be used in combination with image and receptor components.

While the invention has been described in terms of various specific embodiments, those skilled in the art will recognize that the invention can be practiced with modification within the spirit and scope of the claims.

What is claimed is:

1. A method for coupling an X-ray image detector to an X-ray image receptor, said method comprising:

providing at least two image detectors, the two image detectors each having at least one inner edge for substantial inner edge contact between the at least two image detectors to form a detector array, the two image detectors each having at least one outer edge to form an outside perimeter of the detector array;

coupling a substrate layer to a side of the image receptor facing away from the detector array; and coupling an area proximate the outside perimeter of the detector array to the image receptor.

2. A method according to claim 1, wherein coupling an area proximate the outside perimeter of the detector array to the image receptor further comprises coupling an area proximate the outside perimeter of the detector array to the image receptor with a flex circuit to corresponding connections on the image receptor.

3. A method according to claim 1 further comprising configuring at least one outer edge of each image detector for a scan connection.

4. A method according to claim 3 further comprising configuring at least one outer edge of each image detector for a data connection.

5. A method according to claim 4 wherein providing at least two image detectors comprises providing at least two image detectors comprising silicon.

6. A method according to claim 1 wherein coupling an area proximate the outside perimeter of the detector array to the image receptor further comprises fabricating through vias in the image detectors to solder bump arrays between the image detector and the image receptor.

7. An X-ray image detector assembly comprising:

an image detector comprising:

at least a first detector tile and a second detector tile, said first and second detector tiles each having at least one inner edge, said first and second tiles substantially contacting each other along said inner edges to form a detector array, said first and second tiles each having at least one outer edge to form an outside perimeter of said detector array; and an image receptor coupled to an area proximate said outside perimeter of said detector array.

8. An X-ray image detector assembly according to claim 7 wherein said image receptor is coupled to said area proximate said outside perimeter of said detector array to corresponding connections on said image receptor with a flex circuit.

9. An X-ray image detector assembly according to claim 7 wherein said at least one outer edge of each image detector is configured for scan connection.

10. An X-ray image detector assembly according to claim 7 wherein said at least one outer edge of each image detector is configured for data connection.

11. An X-ray image detector assembly according to claim 7 wherein said first and second detector tiles comprise silicon.

12. An X-ray image detector assembly according to claim 7 wherein said image detectors are coupled to said image receptor with through vias to solder bump arrays between said image detector and said image receptor.

13. A method for coupling a medical X-ray image detector to an X-ray image receptor, said method comprising:

providing at least two medical image detectors, the two medical image detectors each having at least one inner edge for substantial inner edge contact between the at least two medical image detectors to form a detector array, the two medical image detectors each having at least one outer edge to form an outside perimeter of the detector array;

coupling a substrate layer to a side of the image receptor facing away from the detector array; and coupling an area proximate the outside perimeter of the detector array to the image receptor.

14. A method according to claim 13, wherein said coupling an area proximate the outside perimeter of the detector array to the image receptor further comprises coupling an area proximate the outside perimeter of the detector array to the image receptor with a flex circuit to corresponding connections on the image receptor.

15. A method according to claim 13 further comprising configuring at least one outer edge of each image detector for a scan connection.

16. A method according to claim 13 further comprising configuring at least one outer edge of each image detector for a data connection.

17. A method according to claim 13 wherein providing at least two medical image detectors comprises providing at least two image detectors comprising silicon.

18. A method according to claim 13 wherein coupling an area proximate the outside perimeter of the detector array to the image receptor further comprises fabricating through vias in the image detectors to solder bump arrays between the image detector and the image receptor.

19. A method for coupling an X-ray image detector to an X-ray image receptor, said method comprising:

providing at least one silicon crystal detector tile for the image detector;

coupling a substrate layer to a side of the image receptor facing away from the detector array; and coupling the image detector to the image receptor by fabricating through vias in the image detector to solder bump arrays between the image detector and the image receptor.

20. A method according to claim 19 wherein the at least one silicon crystal detector tile comprises a single crystal detector tile.

21. A method according to claim 19 wherein the at least one silicon crystal detector tile comprises a polycrystalline detector tile.

22. An X-ray image detector assembly comprising:

an image detector having at least one silicon crystal detector tile;

an image receptor coupled to said image detector by through vias in said image detector to solder bump arrays between said image detector and said image receptor; and a substrate layer coupled to a side of said image receptor facing away from said image detector.

23. An X-ray image detector according to claim 22 wherein said at least one silicon crystal detector tile is a single crystal detector tile.

24. An X-ray image detector according to claim 22 wherein said at least one silicon crystal detector tile is a polycrystalline detector tile.

25. An X-ray image detector according to claim 22 further comprises a scintillator layer applied to an image reception surface of said image detector.

* * * * *

UNITED STATES PATENT AND TRADEMARK OFFICE
CERTIFICATE OF CORRECTION

PATENT NO. : 6,946,661 B2  Page 1 of 1
APPLICATION NO. : 10/327734
DATED : September 20, 2005
INVENTOR(S) : Vafi et al.

It is certified that error appears in the above-identified patent and that said Letters Patent is hereby corrected as shown below:

In Specification, column 4, line 44, between "to a substrate layer" and "." insert therefor --93--.

In Claim 7, column 6, line 42, delete "said detector array; and" and insert therefor --said detector array;--.

In Claim 7, column 6, line 44, delete "said detector array." and insert therefor --said detector array; and a substrate layer coupled to a side of said image receptor facing away from said detector array.--.

Signed and Sealed this

Twentieth Day of November, 2007

JON W. DUDAS
*Director of the United States Patent and Trademark Office*